United States Patent
Yang et al.

(10) Patent No.: US 10,818,596 B2
(45) Date of Patent: Oct. 27, 2020

(54) METHOD FOR FORMING SEMICONDUCTOR DEVICE STRUCTURE WITH GRAPHENE LAYER

(71) Applicant: TAIWAN SEMICONDUCTOR MANUFACTURING CO., LTD., Hsinchu (TW)

(72) Inventors: Tai-I Yang, Hsinchu (TW); Tien-I Bao, Taoyuan (TW); Tien-Lu Lin, Hsinchu (TW); Wei-Chen Chu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/124,567

(22) Filed: Sep. 7, 2018

(65) Prior Publication Data
US 2019/0019753 A1   Jan. 17, 2019

Related U.S. Application Data

(62) Division of application No. 15/016,866, filed on Feb. 5, 2016, now Pat. No. 10,074,607.

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76877* (2013.01); *H01L 21/76892* (2013.01);
(Continued)

(58) Field of Classification Search
CPC . H01L 21/76877–76897; H01L 23/481; H01L 23/53276
See application file for complete search history.

(56) References Cited

U.S. PATENT DOCUMENTS

| | | | |
|---|---|---|---|
| 6,521,923 B1 | 2/2003 | D'Anna et al. | |
| 2011/0006425 A1* | 1/2011 | Wada | H01L 21/76807 257/750 |

(Continued)

OTHER PUBLICATIONS

Arco et al., "Synthesis, Transfer, and Devices of Single- and Few-Layer Graphene by Chemical Vapor Deposition", IEEE Transactions on Nanotechnology, Mar. 2009, vol. 8, No. 2, pp. 135-138.
(Continued)

*Primary Examiner* — Stephen M Bradley
(74) *Attorney, Agent, or Firm* — Birch, Stewart, Kolasch & Birch, LLP

(57) ABSTRACT

A method for forming a semiconductor device structure is provided. The method includes forming a first dielectric layer over a first substrate, and the dielectric layer has a plurality of openings. The method also includes forming a first graphene layer in the openings and over the first dielectric layer, and forming an insulating layer in the first graphene layer. The method further includes forming a second dielectric layer over the first dielectric layer and forming a second graphene layer in and over the second dielectric layer. A portion of the second graphene layer interfaces with a portion of the first graphene layer.

20 Claims, 11 Drawing Sheets

(51) Int. Cl.
 H01L 23/48 (2006.01)
 H01L 23/532 (2006.01)
(52) U.S. Cl.
 CPC ...... *H01L 21/76898* (2013.01); *H01L 23/481* (2013.01); *H01L 23/53276* (2013.01)

(56) References Cited

U.S. PATENT DOCUMENTS

| | | |
|---|---|---|
| 2014/0061916 A1 | 3/2014 | Saito et al. |
| 2014/0106561 A1 | 4/2014 | Niyogi et al. |
| 2014/0217603 A1* | 8/2014 | Moon ............... H01L 23/49827 257/774 |
| 2014/0235051 A1 | 8/2014 | Wann et al. |
| 2014/0273347 A1* | 9/2014 | Tseng ............... H01L 21/76895 438/107 |
| 2015/0097261 A1 | 4/2015 | Harris |
| 2015/0270225 A1 | 9/2015 | Yang et al. |
| 2016/0126190 A1 | 5/2016 | Zhang et al. |
| 2016/0225719 A1 | 8/2016 | Jacob |
| 2016/0276281 A1* | 9/2016 | Sato ..................... H01L 23/485 |
| 2017/0084484 A1* | 3/2017 | Reber ............... H01L 21/76867 |

OTHER PUBLICATIONS

Zhang et al., "Review of Chemical Vapor Deposition of Graphene and Related Applications", Accounts of Chemical Research, 2013, vol. 46, No. 10, pp. 2329-2339.

* cited by examiner

METHOD FOR FORMING SEMICONDUCTOR DEVICE STRUCTURE WITH GRAPHENE LAYER

CROSS REFERENCE TO RELATED APPLICATIONS

This application is a Divisional application of U.S. patent application Ser. No. 15/016,866, filed on Feb. 5, 2016, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the fabrication of semiconductor devices, the size of the semiconductor devices has been continuously reduced in order to increase device density. Accordingly, a multi-layered interconnect structure is provided. The interconnect structure may include one or more conductive lines and via layers.

Although existing interconnect structures and methods of fabricating interconnect structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
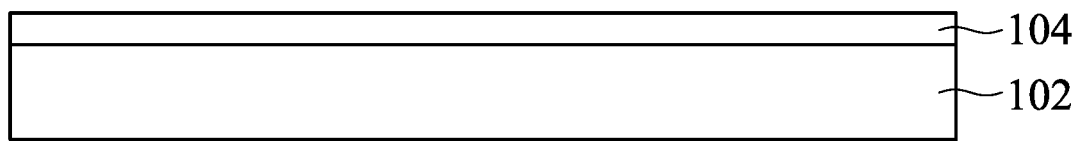
FIGS. 1A-1Q show cross-sectional representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1Q show cross-sectional representations of various stages of forming a semiconductor device structure 100a, in accordance with some embodiments of the disclosure. In some embodiments, the semiconductor device structure 100a is applied to wafer level package (WLP).

Referring to FIG. 1A, a substrate 102 is provided. In some embodiments, the substrate 102 is a wafer. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A first dielectric layer 104 is formed over the substrate 102. The first dielectric layer 104 is made of silicon oxide (SiOx), silicon nitride (SixNy) or silicon oxynitride (SiON) or applicable materials. In some embodiments, the first dielectric layer 104 is made of low-k dielectric material with a dielectric constant (k) less than about 3.5. In some embodiments, low-k dielectric materials include silicon oxycarbide, fluorinated silica glass (FSG), carbon doped silicon oxide, or a combination thereof.

In some embodiments, the first dielectric layer 104 is made of extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the first dielectric layer 104 is formed by a deposition process, such as a plasma enhanced chemical vapor deposition (PECVD) process or by a spin coating process.

Figure 1B:
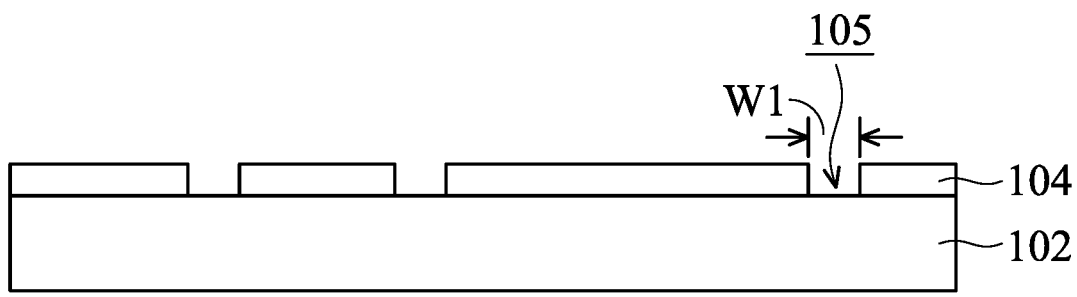

Afterwards, the first dielectric layer 104 is patterned to form a number of openings 105 in the first dielectric layer 104, as shown in FIG. 1B, in accordance with some embodiments of the disclosure. The openings 105 have a first width $W_1$.

The first dielectric layer 104 is patterned by a patterning process. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

Figure 1C:
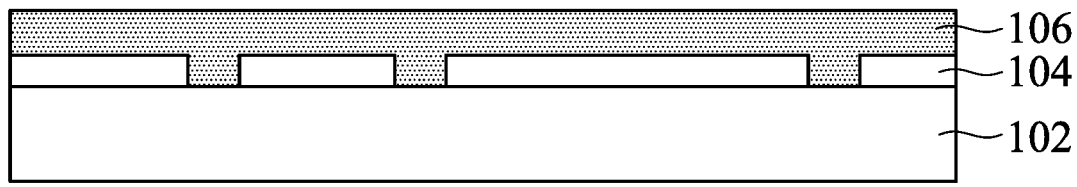

Afterwards, a catalyst layer 106 is formed in the openings 105 and over the first dielectric layer 104, as shown in FIG. 1C, in accordance with some embodiments of the disclosure. The catalyst layer 106 is made of transition metal, such as copper (Cu), cobalt (Co), nickel (Ni), iron (Fe), zinc (Zn), or a combination thereof. The catalyst layer 106 may be a single layer or multiple layers.

Figure 1D:
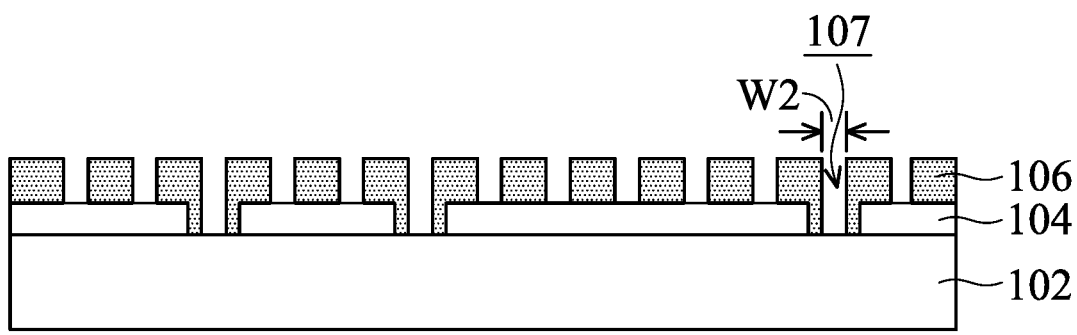

Afterwards, the catalyst layer 106 is patterned to form a number of trenches 107, as shown in FIG. 1D, in accordance with some embodiments of the disclosure. Therefore, the catalyst layer 106 includes a number of portions. The trenches 107 have a second width $W_2$. It should be noted that the first width $W_1$ of the openings 105 is greater than the second width $W_2$ of the trenches 107. A portion of the substrate 102 is exposed by the trenches 107.

In some embodiments, the catalyst layer 106 has a thickness in a range from about 100 nm to about 300 nm. If the thickness of the catalyst layer 106 is smaller than 100 nm, the graphene layer (110, shown in FIG. 1E) may not be formed. If the thickness of the catalyst layer 106 is greater than 300 nm, the trenches 107 may not be formed.

Figure 1E:
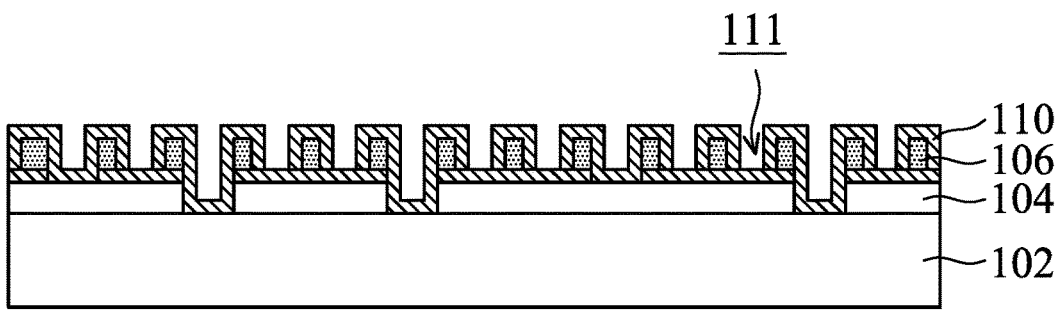

Afterwards, a first graphene layer 110 is formed on the catalyst layer 106, as shown in FIG. 1E, in accordance with some embodiments of the disclosure. The catalyst layer 106 is surrounded by the first graphene layer 110. In addition, the first graphene layer 110 is formed in the bottom portion and sidewall portion of the trenches 107, but the trenches 107 are not completely filled with the first graphene layer 110. As a result, a number of vias 111 are formed between two adjacent portions of the catalyst layer 106.

The first graphene layer 110 has a two dimensional (2D) carbon structure. The first graphene layer 110 has a one-atom thick planar sheet of carbon atoms densely packed in a honeycomb crystal structure. The carbon atoms are packed in a regular $sp^2$-bonded atomic-scale hexagonal pattern to form the first graphene layer 110.

In some embodiments, the first graphene layer 110 is formed by a chemical vapor deposition (CVD) process. In some embodiments, the gas used in the CVD process includes a main gas and a carrier gas. The main gas may include CxHy, such as methane $CH_4$. The carrier gas may include helium (He), argon (Ar) or Helium (He). In some embodiments, the flow rate of the main gas is in a range from about 0.5 sccm to about 50 sccm. In some embodiments, the flow rate of the carrier gas is in a range from about 1 sccm to about 500 sccm.

In some embodiments, the CVD process is performed at a temperature from about 800 degrees (° C.) to about 1200 degrees (° C.). If the temperature is smaller than 800 degrees, the first graphene layer 110 may not be formed. If the temperature is greater than 1200 degrees, the thickness of the first graphene layer 110 may be too thick. In addition, the structure of the first graphene layer 110 may be degraded due to high temperature. As a result, the resistance of the first graphene layer 110 may increase. In some embodiments, the CVD process is operated for a period of time ranging from about 10 minutes to about 180 minutes. If the period of time is less than 10 minutes, the first graphene layer 110 may not be formed. If the period of time is greater than 180 minutes, the structure of the first graphene layer 110 may be degraded, and the resistance of the first graphene layer 110 may increase.

After the CVD process, an anneal process is performed on the first graphene layer 110. In some embodiments, the anneal process is performed at a temperature from about 800 degrees (° C.) to about 1200 degrees (° C.). When the temperature of the annealing process is within above-mentioned range, the structure of the first graphene layer 110 is stabilized.

It should be noted that no active device is pre-formed in the substrate 102. More specifically, no transistor device structure is formed in the substrate 102, and thus no transistor device structure will be damaged by the high temperature while performing the CVD process or the anneal process for forming the first graphene layer 110.

Figure 1F:
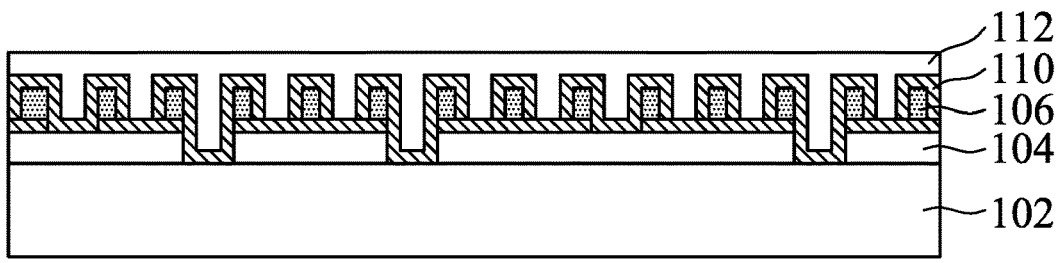

Afterwards, an insulating layer 112 is formed in the vias 111 and on the first graphene layer 110, as shown in FIG. 1F, in accordance with some embodiments of the disclosure.

In some embodiments, the insulating layer 112 is made of a hard mask material. In some embodiments, the insulating layer 112 is made of silicon oxide, silicon nitride, titanium nitride, or a combination thereof. In some embodiments, the insulating layer 112 is formed by low-pressure chemical vapor deposition (LPCVD) or plasma enhanced chemical vapor deposition (PECVD), although other deposition processes may also be used in some other embodiments.

Figure 1G:
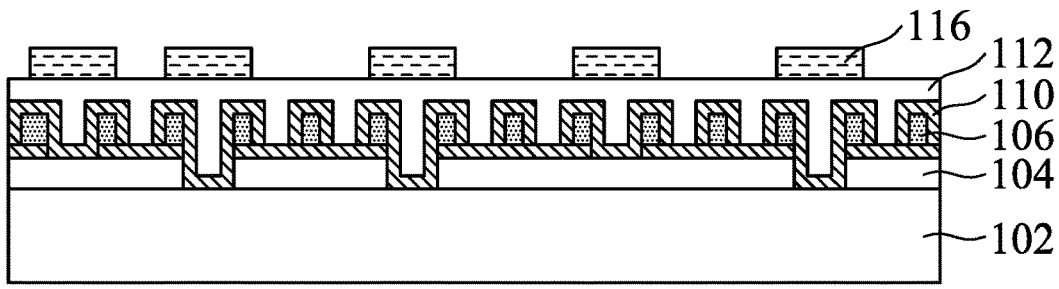

Afterwards, a photoresist layer 116 is formed over the insulating layer 112, as shown in FIG. 1G, in accordance with some embodiments of the disclosure. Next, the photoresist layer 116 is patterned. The photoresist layer 116 is configured to protect the underlying layers from being etched during the following etching processes.

Figure 1H:
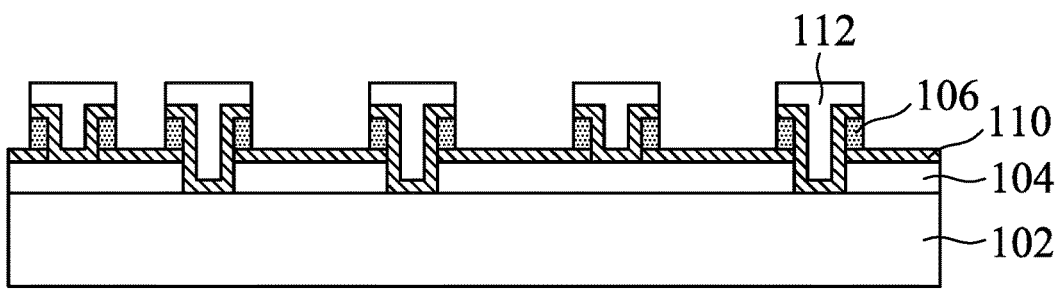

Afterwards, a portion of the insulating layer 112, a portion of the first graphene layer 110 and a portion of the catalyst layer 106 are removed by using the patterned photoresist layer 116 as a mask, as shown in FIG. 1H, in accordance with some embodiments of the disclosure. The portions of the insulating layer 112 which are not covered or protected by patterned photoresist layer 116 are removed. As a result, the insulating layer 112 has a T-shaped structure.

Figure 1I:
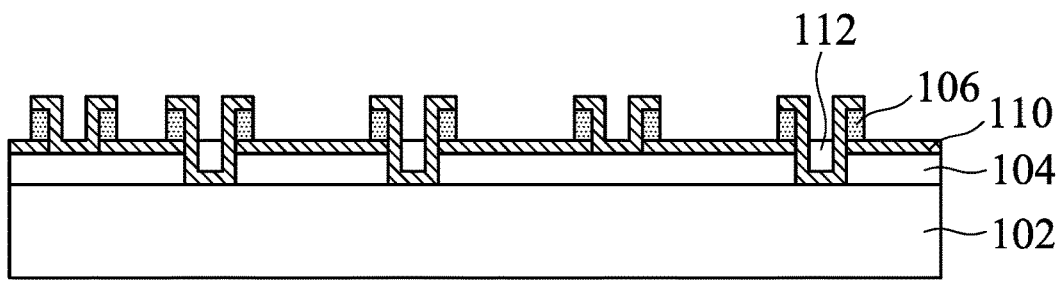

Afterwards, a portion of the insulating layer 112 is removed, as shown in FIG. 1I, in accordance with some embodiments of the disclosure. As a result, a top surface of the insulating layer 112 is lower than a top surface of the first graphene layer 110. In addition, a portion of the first graphene layer 110 is exposed.

Figure 1J:
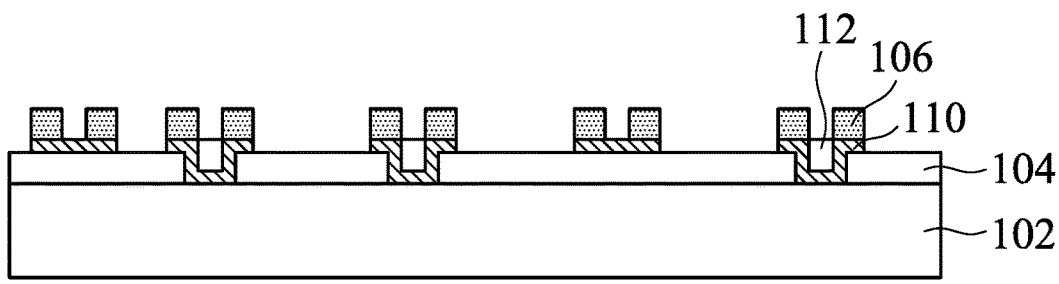

Afterwards, the exposed first graphene layer 110 is removed, as shown in FIG. 1J, in accordance with some embodiments of the disclosure. In some embodiments, the first graphene layer 110 is removed by a dry etching process. In some embodiments, during the dry etching process, a gas including helium (He), oxygen ($O_2$), hydrogen ($H_2$), nitrogen ($N_2$), or fluorocarbon (CxFy) is used.

Figure 1K:
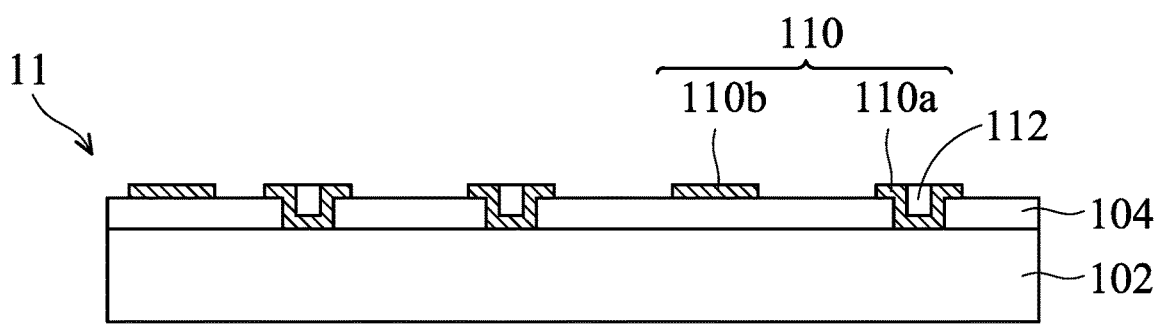

Afterwards, the catalyst layer 106 is removed, as shown in FIG. 1K, in accordance with some embodiments of the disclosure. As a result, a portion of the first graphene layer 110 is exposed. The first dielectric layer 104, the first graphene layer 110 and the insulating layer 112 construct an interconnect structure 11.

The first graphene layer 110 includes a first portion 110a formed in the first dielectric layer 104 and a second portion 110b formed over the first dielectric layer 104. In some embodiments, the first portion 110a of the first graphene layer 110 has a U-shaped structure, and the insulating layer 112 is filled in the middle portion of the U-shaped structure. The top surface of the insulating layer 112 is leveled with a top surface of the first portion 110a of the first graphene layer 110. In some embodiments, the second portion 120a has a planar top surface.

In some embodiments, the catalyst layer 106 is removed by a wet etching process. In some embodiments, the wet etching process includes using a solution, and the solution includes iron chloride ($FeCl_3$) and hydrochloric acid (HCl).

Figure 1L:
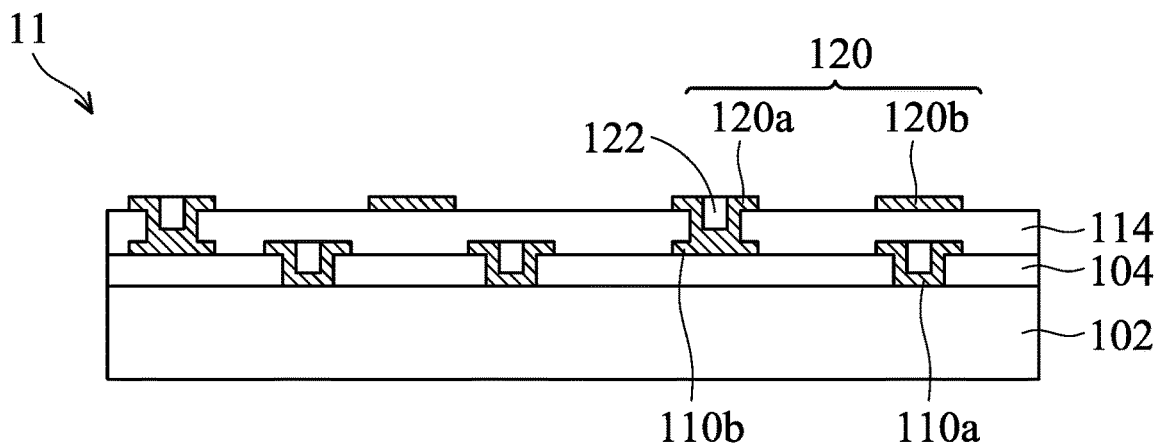

Afterwards, a second dielectric layer 114 is formed over the first dielectric layer 104, and a second graphene layer 120 is formed in and on the second dielectric layer 124, as shown in FIG. 1L, in accordance with some embodiments of the disclosure. The second graphene layer 120 and the second dielectric layer 114 construct a second layer of the interconnect structure 11.

The second graphene layer 120 includes a first portion 120a formed in the second dielectric layer 114 and a second portion 120b formed on the second dielectric layer 114. The first portion 120a of the second graphene layer 120 also has U-shaped structure, and a second insulating layer 122 is formed in the middle portion of the U-shaped structure. The bottom portion of the U-shaped first portion 120a of the second graphene layer 120 is electrically connected to the second portion 110b of the first graphene layer 110. The formation method of the second graphene layer 120 is like that of the first graphene layer 110, and therefore the processes are omitted.

Figure 1M:
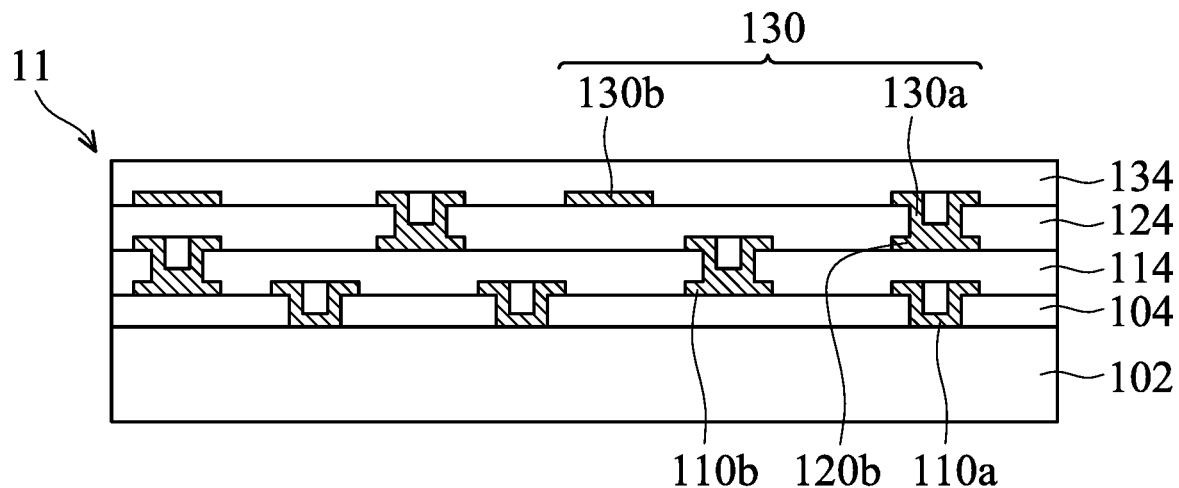

Afterwards, a third dielectric layer 124 is formed on the second dielectric layer 124, and a third graphene layer 130 is formed in and on the third dielectric layer 124, as shown in FIG. 1M, in accordance with some embodiments of the disclosure. The interconnect structure 11 further includes the third layer including the third dielectric layer 124 and the third graphene layer 130.

The third graphene layer 130 includes a first portion 130a formed in the third dielectric layer 124 and a second portion 130b formed on the third dielectric layer 124. The first portion 130a of the third graphene layer 130 has a U-shaped structure, and the second portion 130b has a planar top surface. Afterwards, a fourth dielectric layer 134 is formed on the third dielectric layer 124. It should be noted that the number of graphene layers and the number of dielectric layers may be adjusted according to actual application.

Figure 1N:
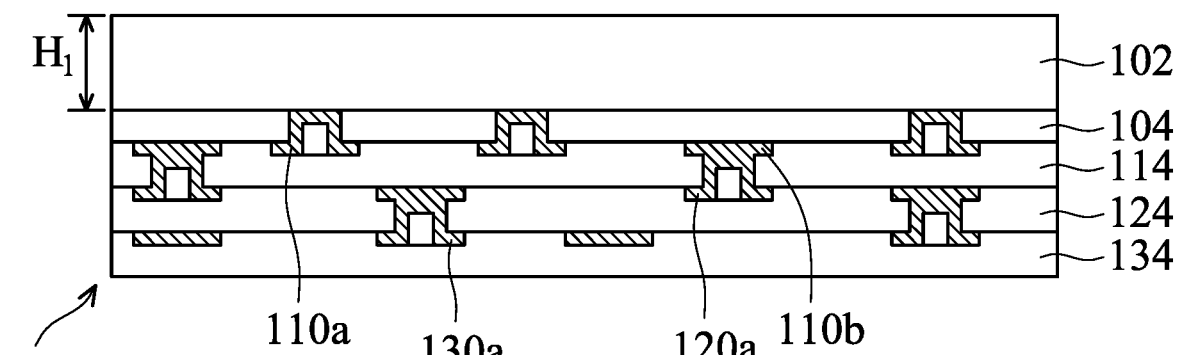

Afterwards, the substrate 102 is flipped, and the substrate 102 is located at the top of the structure in FIG. 1N, in accordance with some embodiments of the disclosure.

Figure 1O:
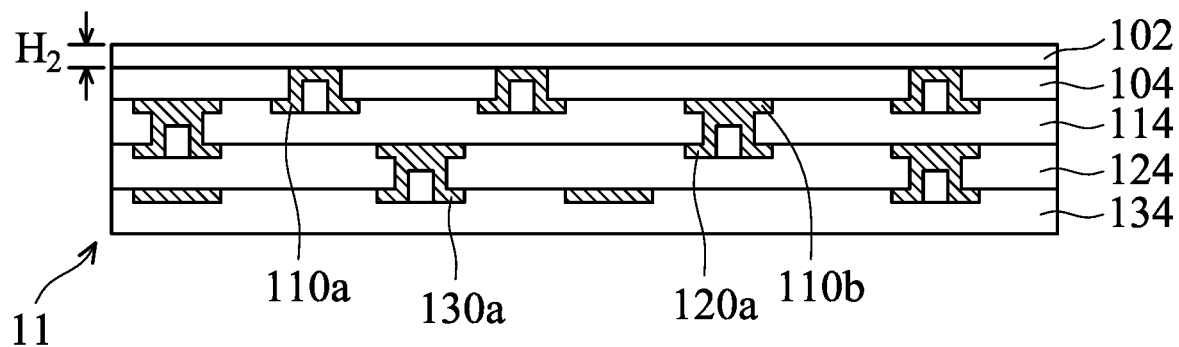

Afterwards, the substrate 102 is thinned by a thinning process, as shown FIG. 1O, in accordance with some embodiments of the disclosure. In some embodiments, the substrate 102 is thinned by a chemical mechanical polishing (CMP) process. As a result, the substrate 102 has a reduced thickness $H_2$ from original thickness $H_1$. After the thinning process, a wet etching operation is performed to remove the defects formed on top surface of second substrate 202.

Figure 1P:
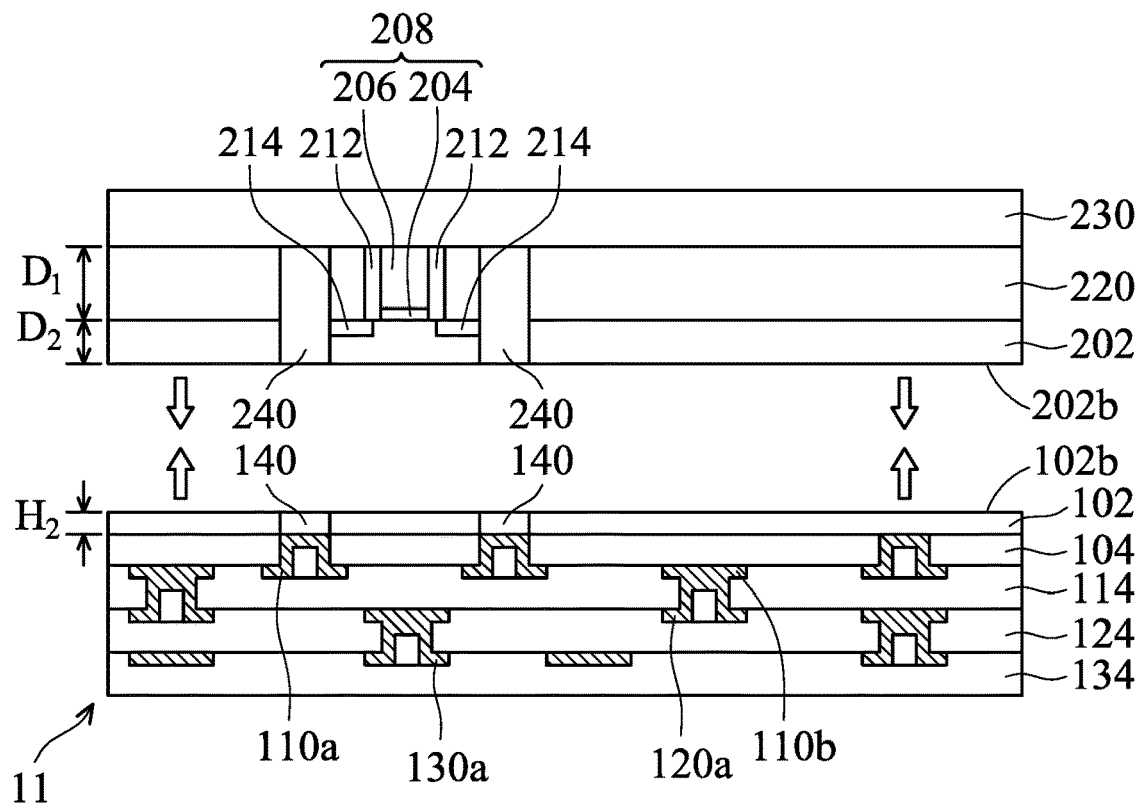
Figure 1Q:
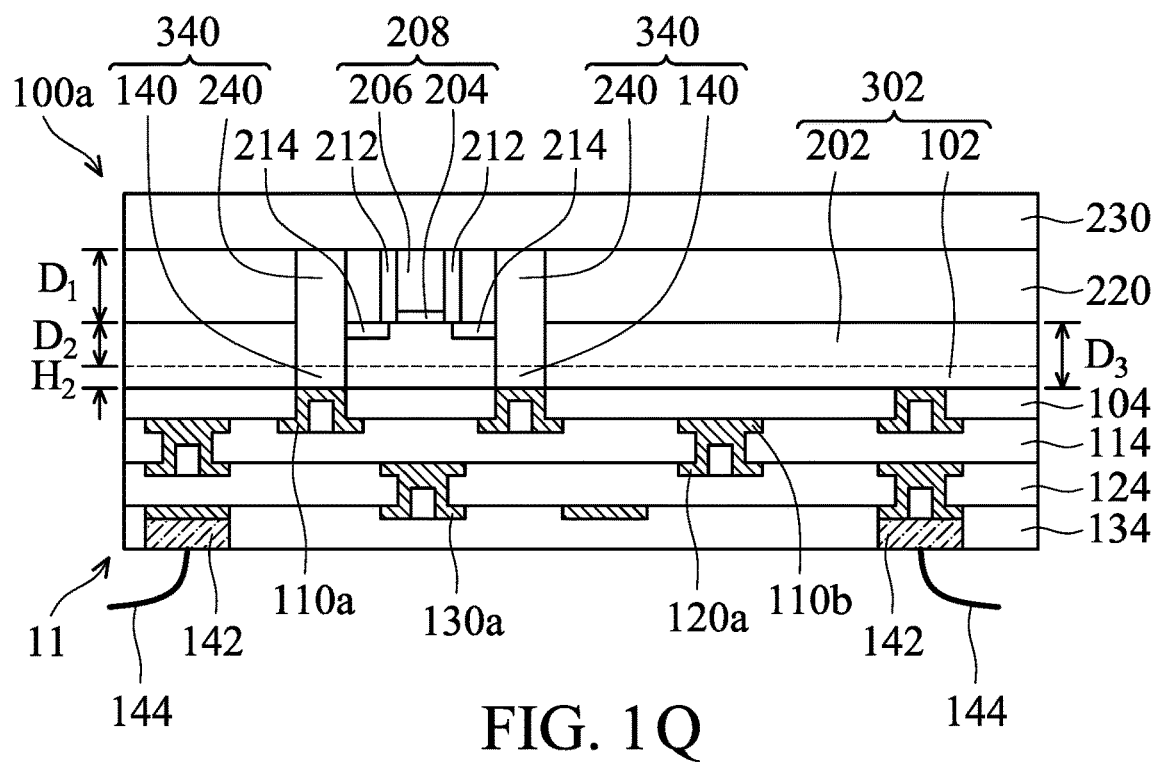

Afterwards, another structure with a transistor device on a second substrate 202 is prepared, and the first substrate 102 faces to a backside 202b of the second substrate 202, as shown FIG. 1P, in accordance with some embodiments of the disclosure.

A first through silicon via (TSV) 140 is formed through the first substrate 102, and the first TSV 140 is in direct contact with and electrically connected to the bottom portion of the first portion 110a of the first graphene layer 110.

A gate structure 208 is formed over the second substrate 202, and it includes a gate dielectric layer 204 and a gate electrode layer 206 on the gate dielectric layer 204. The spacers 212 are formed on the opposite sidewalls of the gate structure 208. Source/drain (S/D) structures 214 are formed in the second substrate 202. In addition, an inter-layer dielectric (ILD) layer 220 is formed over the second substrate 202, and a second through silicon via (TSV) 240 is formed through the ILD layer 220 and the second substrate 202. The second TSV 240 is electrically connected to the S/D structures 214.

In some embodiments, the ILD layer 220 has a first thickness $D_1$, and the second substrate 202 has a second thickness $D_2$. The second TSV 240 passes through the ILD layer 260 and the second substrate 202, and therefore the second TSV 240 has a depth which is the sum of the first thickness $D_1$ and the second thickness D2. In some embodiments, the substrate 102 has a thickness $H_2$, and the first TSV 140 has a depth $H_2$.

In addition, before the first substrate 102 is bonded to the second substrate 202, the first TSV 140 is aligned with the second TSV 240. Next, the substrate 102 and the second substrate 202 are pre-treated. The substrates 102, 202 are pre-treated by a dry treatment or a wet treatment. The dry treatment includes a plasma treatment. The plasma treatment is performed in an inert environment, such as an environment filled with inert gas including $N_2$, Ar, He or a combination thereof. Bonding of the substrates 102, 202 is performed under pressure and heat.

Afterwards, the backside 102b of the substrate 102 faces the backside 202b of the second substrate 202, and they are bonded together to form a 3DIC stacking structure, as shown FIG. 1Q, in accordance with some embodiments of the disclosure. In some embodiments, the first substrate 102 and the second substrate both are silicon (Si) wafers, and two wafers are then bonded together. As a result, the semiconductor device structure 100a is obtained. Afterwards, a protection layer 230 is formed on the ILD layer 220. In some embodiments, the protection layer 230 is made of polybenzoxazole (PBO), benzocyclobuten (BCB), silicone, acrylates, siloxane, or a combination thereof.

The second TSV 240 is electrically connected to the first TSV 140 to form a combined TSV 340, and the substrate 102 and the second substrate 202 are combined to form a combined substrate 302. The dashed line is used to show the substrate 102 and the second substrate 202. In fact, no observed interface is between the substrate 102 and the second substrate 202. The combined TSV 340 is configured to transfer the signal of the S/D structures 214 to the interconnect structure 11. A conductive pad 142 and conductive line 144 are configured to transfer the signal of the interconnect structure 11 to the outer device. The combined TSV 340 is formed over the inverted U-shaped first graphene layer 110.

In some embodiments, the combined substrate 302 has a thickness which is the sum of the $D_2$ of the second substrate 202 and $H_2$ of the substrate 102. The combined TSV 340 passes through the ILD layer 220 and the combined substrate 302. Therefore, the combined TSV 340 has a depth which is the sum of the first depth $D_1$ in the ILD layer 220 and a third depth $D_3$ in the combined substrate 302, and the first depth $D_1$ is greater than the third depth $D_3$.

As mentioned above, the first graphene layer 110 is formed on the substrate 102 to be used as a portion of the interconnect structure 11. The first graphene layer 110 has a relatively lower resistance and lower capacitance, compared with the metal conductive layer (such as a copper (Cu) layer). Furthermore, the first graphene layer 110 provides a high reliability and as a good adhesion between the first dielectric layer 104 and the first insulating layer 112. Therefore, the RC relay is reduced to improve the performance of the semiconductor device structure 100a.

It should be noted that no transistor device is pre-formed in the substrate 102, and the gate structure 208 is formed in another second substrate 202. The interconnect structure 11 and the gate structure 208 are formed at different substrate, separately. Therefore, the gate structure 208 formed over the second substrate 202 is not damaged by the high temperature process during the formation of the first graphene layer 110 over the first substrate 102.

FIGS. 2A-2F show cross-sectional representations of various stages of forming a semiconductor device structure 100b, in accordance with some embodiments of the disclosure. The semiconductor device structure 100b is similar to, or the same as, the semiconductor device structure 100a shown in FIG. 1Q, except the gate structure 208 is formed on the frontside 102a of the substrate 102. Processes and materials used to form semiconductor device structure 100b may be similar to, or the same as, those used to form the semiconductor device structure 100a and are not repeated herein.

Figure 2A:
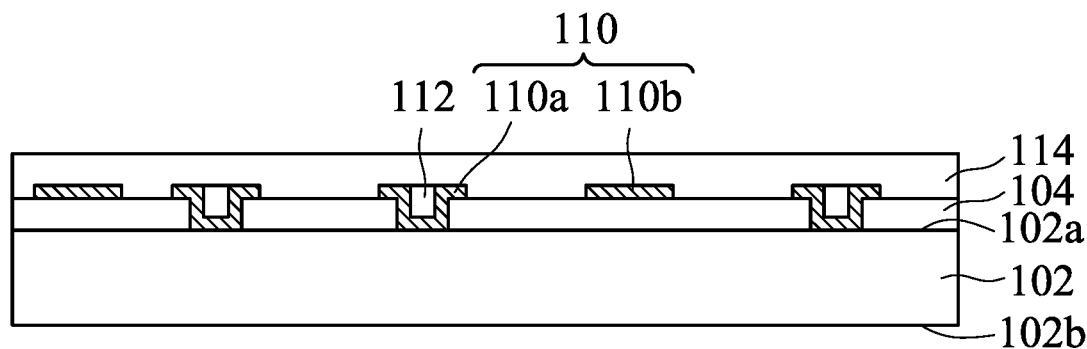
FIGS. 2A-2F show cross-sectional representations of various stages of forming a semiconductor device structure, in accordance with some embodiments of the disclosure.

As shown in FIG. 2A, the substrate 102 includes a frontside 102a and a backside 102b. The first dielectric layer 104 is formed over the frontside 102a of the substrate 102. The first portion 110a of the first graphene layer 110 is formed in the first dielectric layer 104, and the second portion 110b of the first graphene layer 110 is formed over the first dielectric layer 104. The first portion 110a has a U-shaped structure and the insulating layer 112 is formed in the middle portion of the U-shaped structure. The second dielectric layer 114 is formed over the first dielectric layer 104. The top surface of the first portion 110a is level with the top surface of the insulating layer 112.

Figure 2B:
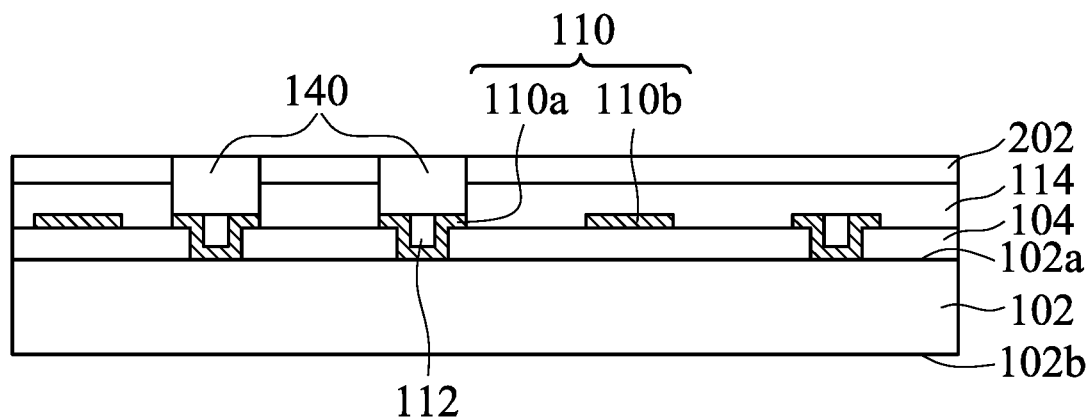

Afterwards, the second substrate 202 is formed over the second dielectric layer 114 over the frontside 102a of the substrate 102, and the first TSV 140 is formed through the second substrate 202, as shown in FIG. 2B, in accordance with some embodiments of the disclosure. More specifically, the first TSV 140 is formed over the first portion 110a of the first graphene layer 110 and over the insulating layer 112. The first TSV 140 is electrically connected to the first graphene layer 110.

Figure 2C:
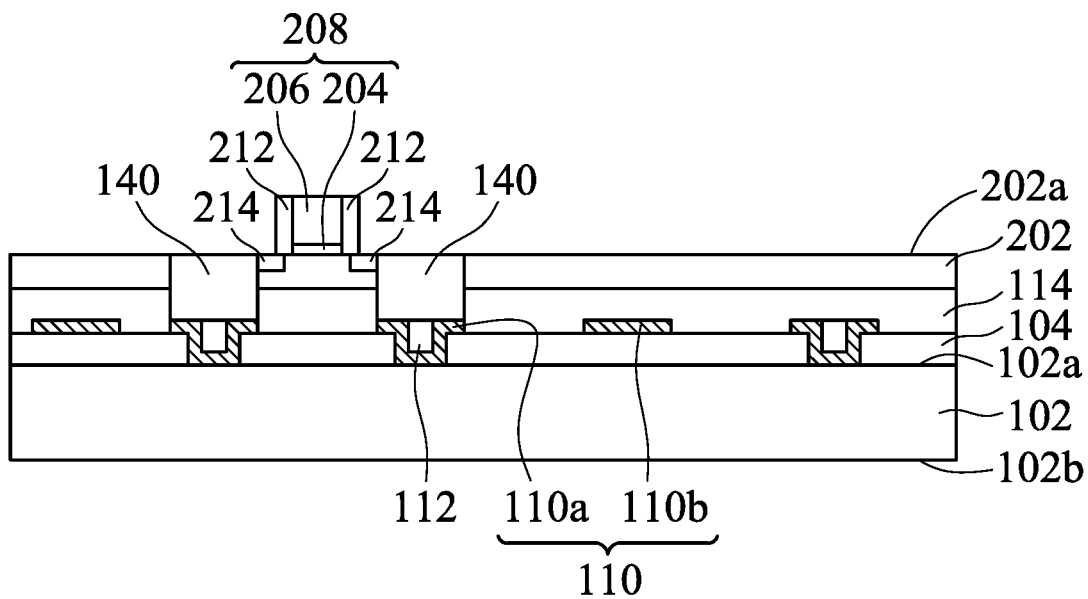

Afterwards, the gate structure 208 is formed over a frontside 202a of the second substrate 202, as shown in FIG. 2C, in accordance with some embodiments of the disclosure. In some embodiments, the gate structure 208 is a part of a FinFET device structure.

In the first embodiments, as shown in FIG. 1Q, the gate structure 208 is formed over the backside 102b of the substrate 102, and it is formed over the inverted U-shaped first graphene layer 110. In the second embodiment, as shown in FIG. 2C, the gate structure 208 is formed over the U-shaped first graphene layer 110.

The gate structure 208 includes the gate dielectric layer 204 and the gate electrode layer 206. The spacers 212 are formed on opposite sidewalls of the gate structure 208. The S/D structures 214 are formed in the second substrate 202 and are electrically connected to the first TSV 140.

Figure 2D:
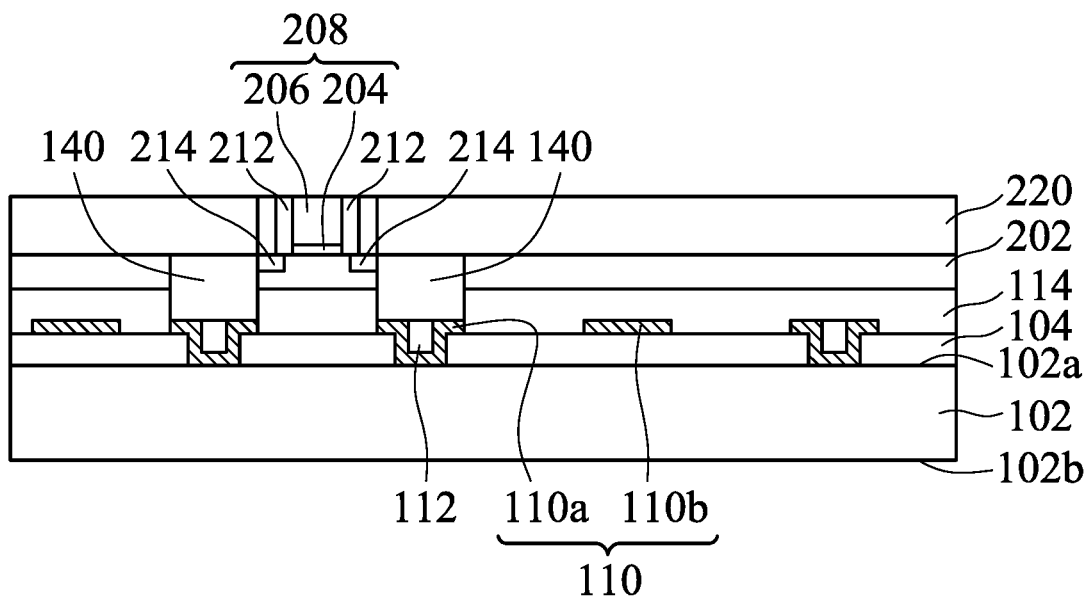

Afterwards, the ILD layer 220 is formed over the first TSV 140, the second substrate 202, and the S/D structures 214, as shown in FIG. 2D, in accordance with some embodiments of the disclosure.

Figure 2E:
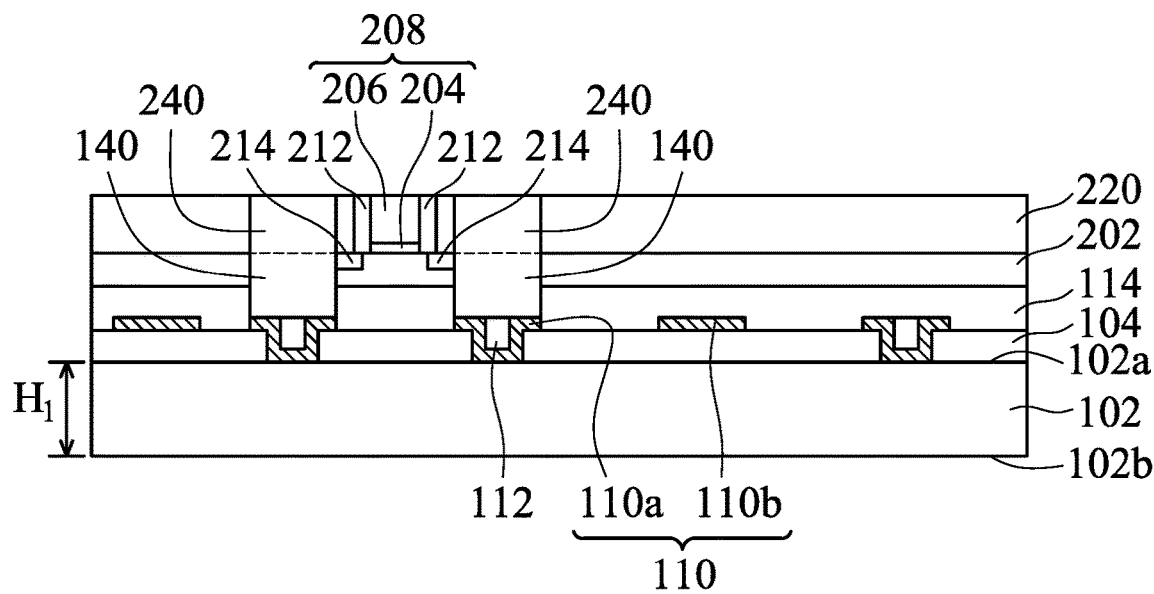

Afterwards, the second TSV 240 is formed through the ILD layer 220 to connect to the first TSV 140, as shown in FIG. 2E, in accordance with some embodiments of the disclosure. The second TSV 240 is electrically connected to the first TSV 140.

Figure 2F:
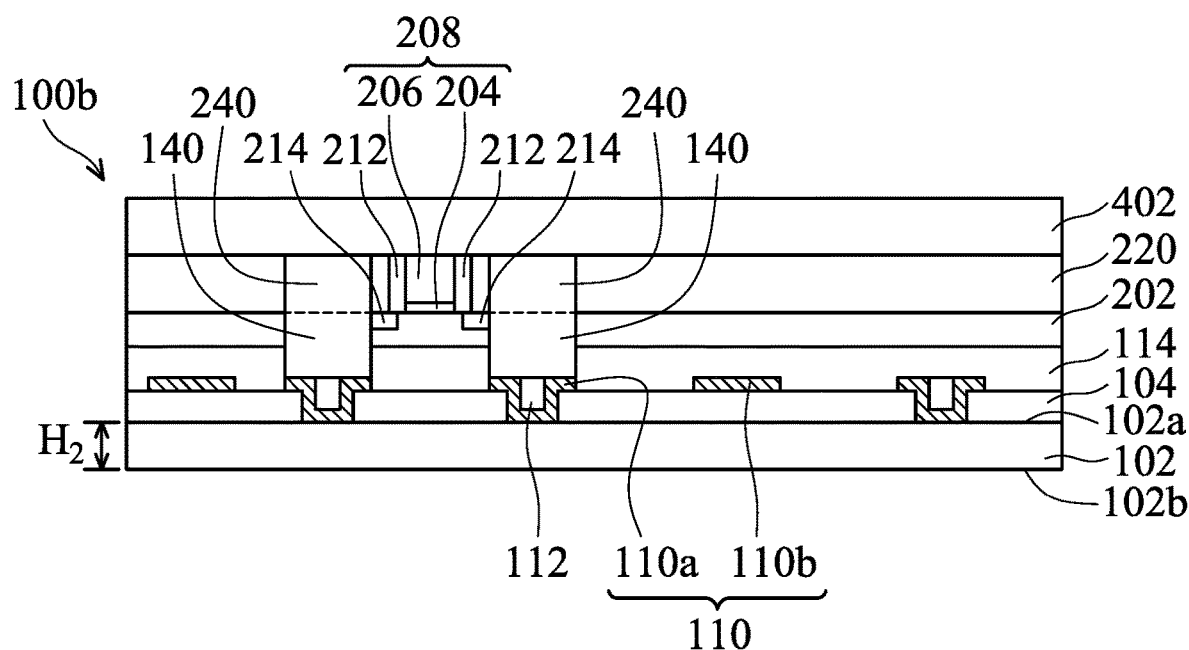

Afterwards, a third substrate 402 is formed over the ILD layer 220, as shown in FIG. 2F, in accordance with some embodiments of the disclosure. Afterwards, the substrate 102 is thinned by a polishing process, such as a CMP process. The thickness of the substrate 102 is reduced from first height $H_1$ to the second height $H_2$. Another interconnect structure (not shown) may be formed in the third substrate 302 to connect to the second TSV 240. Therefore, the semiconductor device structure 100b is obtained.

It should be noted that the gate structure 208 of the transistor device is fabricated after the first graphene layer 110 is formed. Therefore, the thermal process used in formation of the first graphene layer 110 does not affect the formation of the transistor device.

FIGS. 3A-3F show cross-sectional representations of various stages of forming a semiconductor device structure 100c, in accordance with some embodiments of the disclosure. The semiconductor device structure 100c is similar to, or the same as, the semiconductor device structure 100b shown in FIG. 2F, except the interconnect structure 11 has multiple layers. Processes and materials used to form semiconductor device structure 100c may be similar to, or the same as, those used to form semiconductor device structure 100b and are not repeated herein.

Figure 3A:
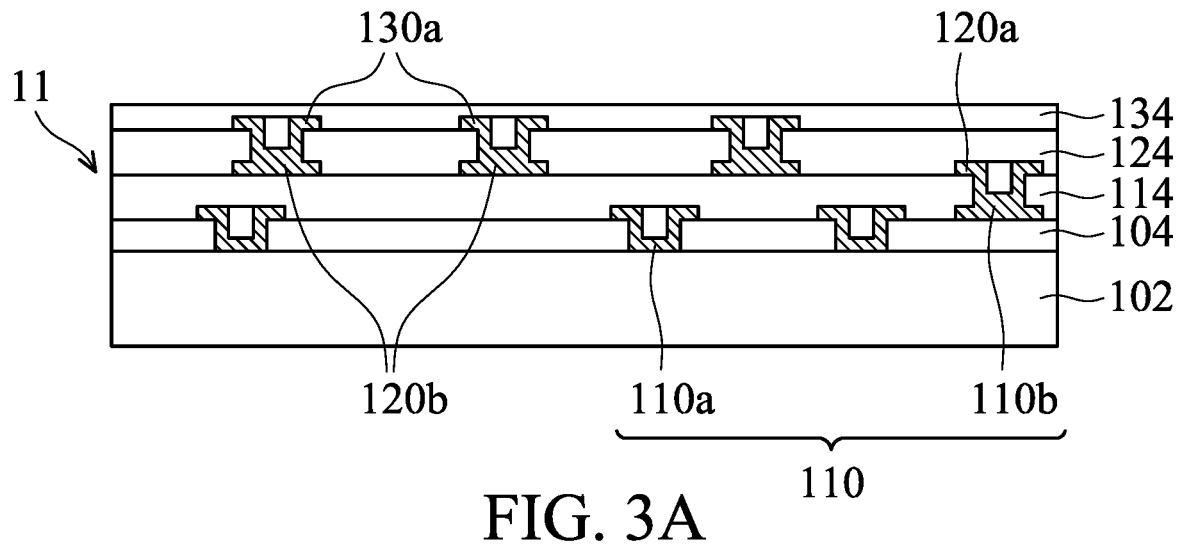
FIGS. 3A-3F show cross-sectional representations of various stages of forming a semiconductor device structure, in accordance with some embodiments of the disclosure.

As shown in FIG. 3A, the first graphene layer 110 is formed in the first dielectric layer 104, and the second graphene layer 120 is formed in the second dielectric layer 114. The first portion 130a of the third graphene layer 130 is formed in the third dielectric layer 124. The fourth dielectric layer 134 is formed on the third dielectric layer 124.

Figure 3B:
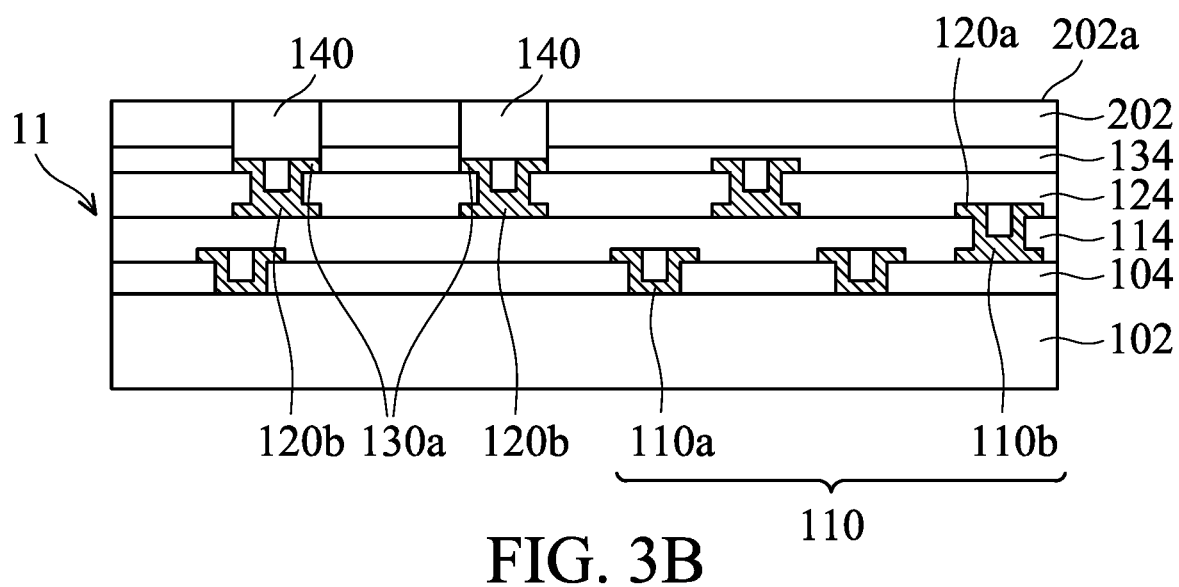

Afterwards, the second substrate 202 is formed over the fourth dielectric layer 134, and the first TSV 140 is formed through the second substrate 202, as shown in FIG. 3B, in accordance with some embodiments of the disclosure.

Figure 3C:
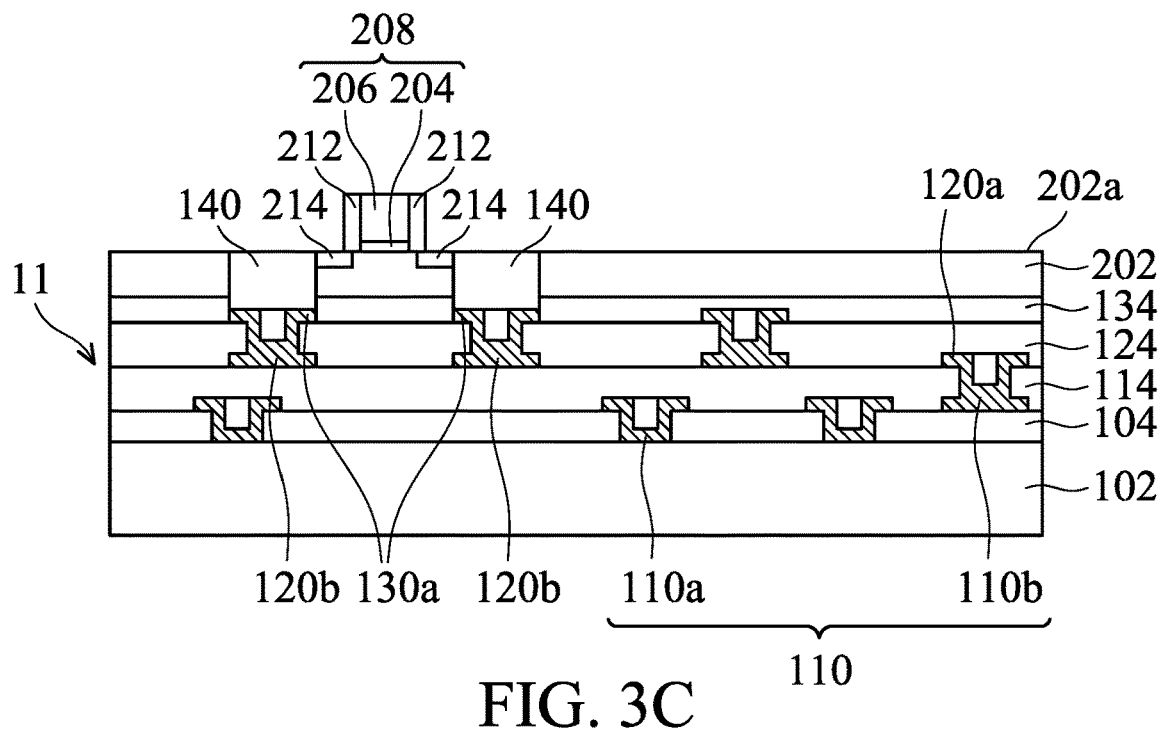

Afterwards, the gate structure 208 is formed over a frontside 202a of the second substrate 202, as shown in FIG. 3C, in accordance with some embodiments of the disclosure. In some embodiments, the gate structure 208 is a part of a FinFET device structure.

Figure 3D:
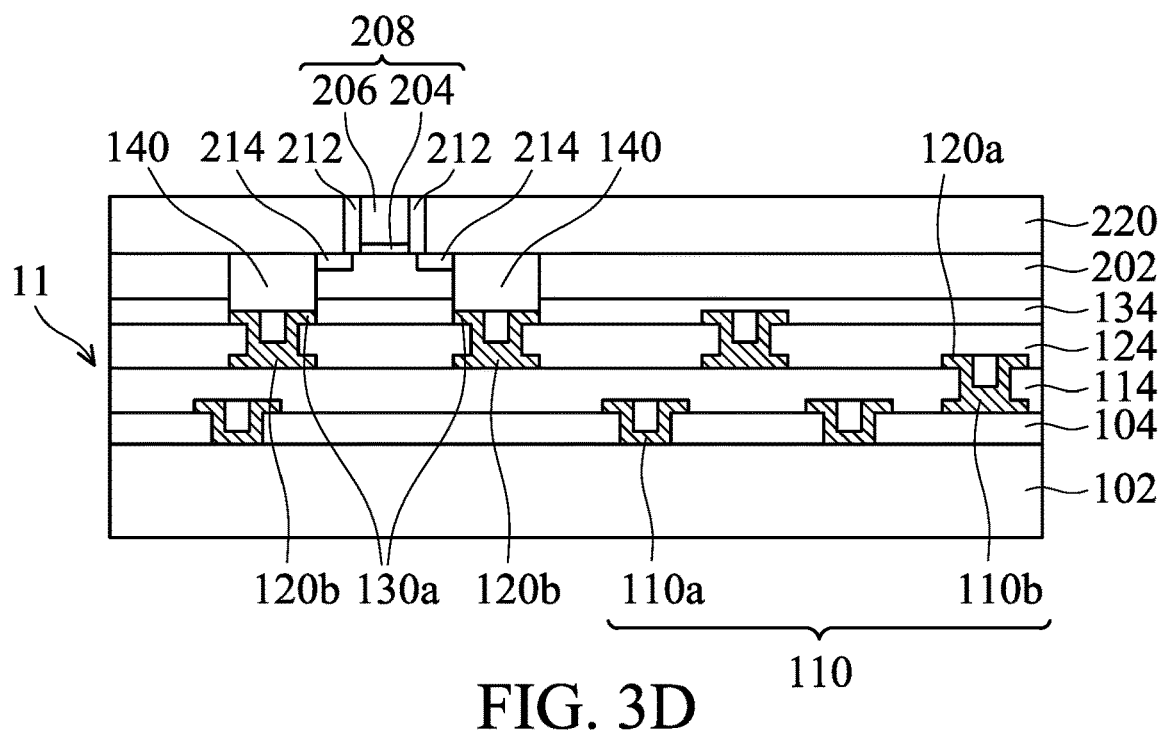

Afterwards, the ILD layer 220 is formed over the first TSV 140, the second substrate 202, and the S/D structures 214, as shown in FIG. 3D, in accordance with some embodiments of the disclosure.

Figure 3E:
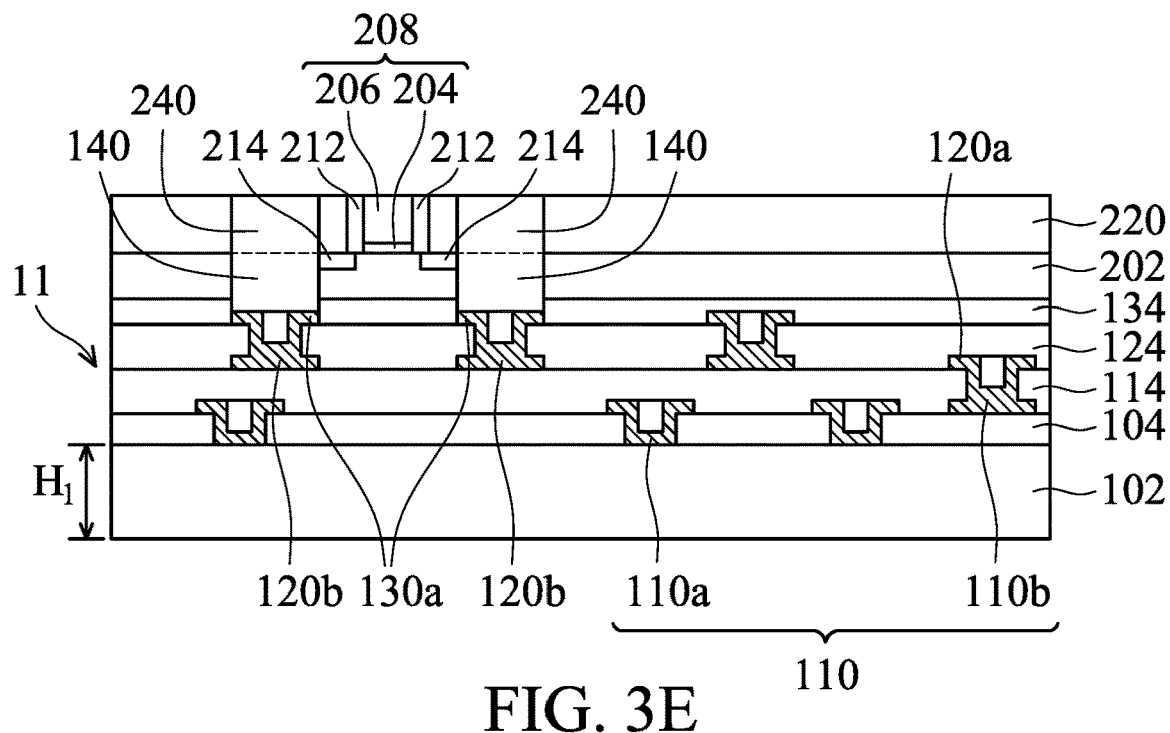

Afterwards, the second TSV 240 is formed through the ILD layer 220 to connect to the first TSV 140, as shown in FIG. 3E, in accordance with some embodiments of the disclosure. The second TSV 240 is electrically connected to the first TSV 140.

Figure 3F:
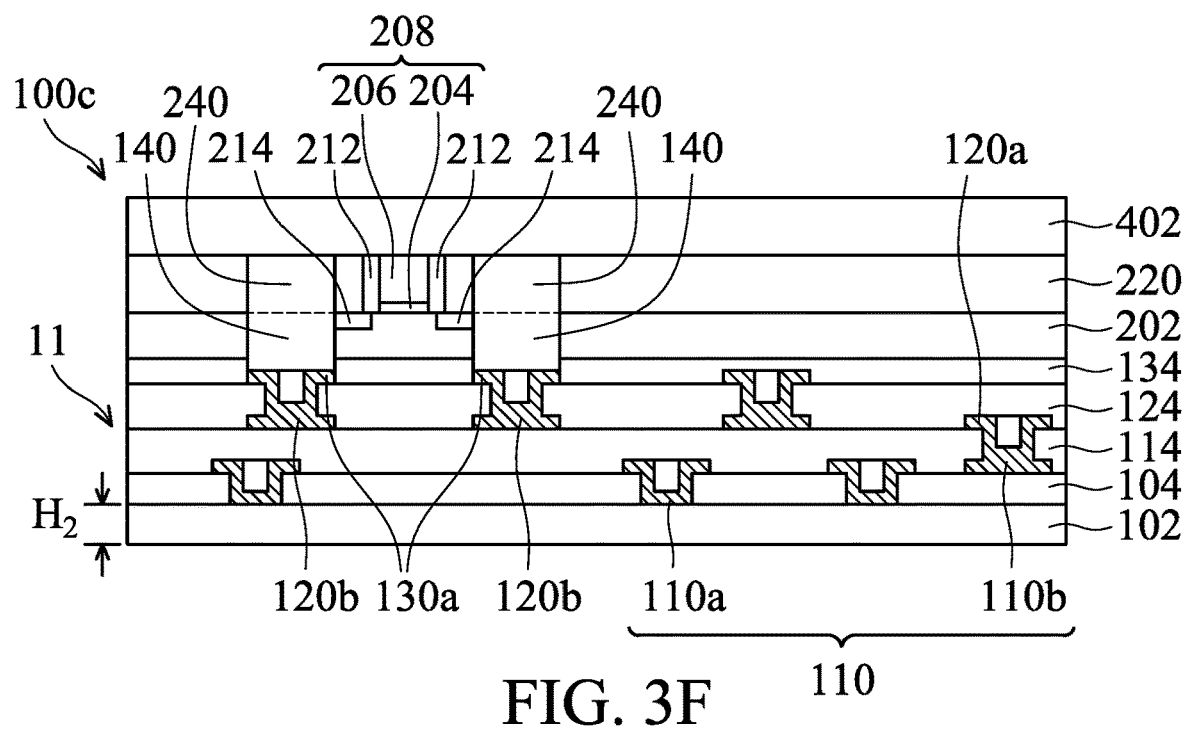

Afterwards, a third substrate 402 is formed over the ILD layer 220, as shown in FIG. 3F, in accordance with some embodiments of the disclosure. Afterwards, the substrate 102 is thinned. Therefore, the semiconductor device structure 100c is obtained.

The interconnect structure 11 has more than one layer of the graphene layer. In this embodiment, the graphene layer includes the U-shaped first graphene layer 110, the U-shaped second graphene layer 120 and the U-shaped third graphene layer 130. The TSV including the first TSV 140 and the second TSV 240 is formed on the U-shaped third graphene layer 130. The graphene layers 110, 120 and 130 have a relatively lower resistance and lower capacitance, and therefore RC delay is reduced. In addition, the performance of the semiconductor device structure 100c is improved.

Embodiments for a semiconductor device structure and methods for forming the same are provided. An interconnect structure is formed over a substrate, and the interconnect structure includes a first graphene layer. The first graphene layer includes a first portion in a dielectric layer and a second portion on the dielectric layer. The first portion of the first graphene layer has a U-shaped structure, and a first insulating layer is formed in the middle portion of the U-shaped. A second graphene layer and/or a third graphene layer is formed over the first graphene layer. The first graphene layer has a relatively lower resistance and lower capacitance, and therefore RC delay is reduced. In addition, the first graphene layer provides a higher reliability. As a result, the performance of the semiconductor device structure is improved.

In some embodiments, a method for forming a semiconductor device structure is provided. The method includes forming an interconnect structure over a first substrate. The step for forming the interconnect structure over the first substrate includes forming a first dielectric layer over a first substrate, the first dielectric layer has a plurality of openings and forming a catalyst layer over the first dielectric layer and in the openings. The step for forming the interconnect structure further includes forming a graphene layer on the catalyst layer, wherein the catalyst layer is surrounded by the graphene layer, forming an insulating layer on the graphene layer, and patterning the insulating layer, the graphene layer and the catalyst layer. The graphene layer is formed in the openings, and the insulating layer is formed on the graphene layer and in the openings. The step for forming the interconnect structure also includes removing the catalyst layer to leave a portion of the graphene layer in the first dielectric layer and on the first dielectric layer. The graphene layer includes a first portion formed in the first dielectric layer and a second portion formed over the first dielectric layer.

In some embodiments, a semiconductor device structure is provided. The semiconductor device structure includes a substrate and an interconnect structure formed over the substrate. The interconnect structure includes a first dielectric layer formed over the substrate, and a first graphene layer formed in and on the first dielectric layer. The first graphene layer includes a first portion in the first dielectric layer and a second portion on the first dielectric layer and a first insulating layer formed over the first portion of the first graphene layer.

In some embodiments, a method for forming a semiconductor device structure is provided. The method includes forming a first dielectric layer over a first substrate, and the first dielectric layer has a plurality of openings. The method also includes forming a catalyst layer over the first dielectric layer and in the openings, and patterning the catalyst layer to form a plurality of trenches. The method further includes forming a U-shaped graphene layer on the catalyst layer and in the trenches, and forming an insulating layer in a recessed portion of the U-shaped graphene layer. The method also includes removing the catalyst layer to leave a portion of the U-shaped graphene layer in the first dielectric layer and on the first dielectric layer, and the U-shaped graphene layer includes a first portion formed in the first dielectric layer and a second portion formed over the first dielectric layer.

In some embodiments, a semiconductor device structure is provided. The semiconductor device structure include a first substrate and an interconnect structure formed over the first substrate. The interconnect structure includes a U-shaped first graphene layer formed in a first dielectric layer. The semiconductor device structure also include a second substrate formed over the interconnect structure, and the interconnect structure is formed between the first substrate and the second substrate. The semiconductor device structure further includes a transistor device structure formed over the second substrate.

In some embodiments, a method for forming a semiconductor device structure is provided. The method includes forming a first dielectric layer over a first substrate, and the dielectric layer has a plurality of openings. The method also includes forming a first graphene layer in the openings and over the first dielectric layer, and forming an insulating layer in the first graphene layer. The method further includes forming a second dielectric layer over the first dielectric layer and forming a second graphene layer in and over the second dielectric layer. A portion of the second graphene layer interfaces with the a portion of the first graphene layer.

In some embodiments, a method for forming a semiconductor device structure is provided. The method includes forming an interconnect structure over a first substrate, and forming the interconnect structure over a first substrate includes forming a dielectric layer over a first substrate, and the dielectric layer has a plurality of openings. Forming the interconnect structure also includes forming a catalyst layer over the dielectric layer and in the openings and forming a graphene layer on the catalyst layer. The catalyst layer is surrounded by the graphene layer. Forming the interconnect structure further includes forming an insulating layer on the graphene layer and patterning the insulating layer, the graphene layer and the catalyst layer. The graphene layer is formed in the openings, and the insulating layer is formed on the graphene layer and in the openings. Forming the interconnect structure also includes removing the catalyst layer to leave a portion of the graphene layer in the dielectric layer and on the dielectric layer, and the graphene layer includes a first portion formed in the dielectric layer and a second portion formed over the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming an interconnect structure over a first substrate, wherein forming the interconnect structure over the first substrate comprises:
    forming a first dielectric layer over the first substrate, wherein the first dielectric layer has a plurality of openings;
    forming a catalyst layer over the first dielectric layer and in the openings;
    forming a graphene layer on the catalyst layer, wherein the catalyst layer is surrounded by the graphene layer;
    forming an insulating layer on the graphene layer;
    patterning the insulating layer, the graphene layer and the catalyst layer, wherein the graphene layer is formed in the openings, and the insulating layer is formed on the graphene layer and in the openings; and
    removing the catalyst layer to leave a portion of the graphene layer in the first dielectric layer and on the first dielectric layer, wherein the graphene layer comprises a first portion formed in the first dielectric layer and a second portion formed over the first dielectric layer.

2. The method for forming the semiconductor device structure as claimed in claim 1, before forming the graphene layer on the catalyst layer, further comprising:
patterning the catalyst layer to form a plurality of trenches, wherein each of the openings has a first width, each of the trenches has a second width, and the first width is greater than the second width.

3. The method for forming the semiconductor device structure as claimed in claim 1, before removing the catalyst layer, further comprising:
removing a portion of the insulating layer to expose a portion of the graphene layer; and
removing the exposed portion of the graphene layer.

4. The method for forming the semiconductor device structure as claimed in claim 1, further comprising:
bonding the first substrate to a second substrate, wherein a transistor device structure is pre-formed over the second substrate.

5. The method for forming the semiconductor device structure as claimed in claim 1, further comprising:
forming a second substrate below the first substrate; and
forming a transistor device structure below the second substrate;
forming a through-silicon via (TSV) through the second substrate and a portion of the interconnect structure, wherein the TSV is electrically connected to the first portion of the graphene layer.

6. The method for forming the semiconductor device structure as claimed in claim 1, further comprising:
forming a second dielectric layer below the first dielectric layer; and
forming a second graphene layer in and below the second dielectric layer, wherein a portion of the second graphene layer interfaces with the second portion of the first graphene layer.

7. The method for forming the semiconductor device structure as claimed in claim 6, further comprising:
forming a third dielectric layer below the second dielectric layer; and
forming a third graphene layer in and below the third dielectric layer, wherein a portion of the third graphene layer interfaces with a portion of the second graphene layer.

8. The method for forming the semiconductor device structure as claimed in claim 6, wherein the second graphene layer comprises a first portion in the second dielectric layer and a separated second portion completely below the second dielectric layer, and the second portion of the first graphene layer is electrically connected to the first portion of the second graphene layer.

9. The method for forming the semiconductor device structure as claimed in claim 1, further comprising:
forming a first TSV in the first substrate, wherein the first TSV is on the first graphene layer.

10. The method for forming the semiconductor device structure as claimed in claim 1, further comprising:
performing an annealing process on the first graphene layer, wherein no active device is formed in the first substrate before performing the annealing process.

11. A method for forming a semiconductor device structure, comprising:
forming a first dielectric layer over a first substrate, wherein the first dielectric layer has a plurality of openings;

forming a catalyst layer over the first dielectric layer and in the openings;
patterning the catalyst layer to form a plurality of trenches;
forming a U-shaped graphene layer on the catalyst layer and in the trenches;
forming an insulating layer in a recessed portion of the U-shaped graphene layer;
removing the catalyst layer to leave a portion of the U-shaped graphene layer in the first dielectric layer and on the first dielectric layer, wherein the U-shaped graphene layer comprises a first portion formed in the first dielectric layer and a second portion formed over the first dielectric layer.

12. The method for forming the semiconductor device structure as claimed in claim 11, further comprising:
forming a through-silicon via (TSV) in the first substrate, wherein a portion of the first graphene layer is in direct contact with the TSV.

13. The method for forming the semiconductor device structure as claimed in claim 11, further comprising:
forming a second dielectric layer below the first dielectric layer; and
forming a second graphene layer in and below the second dielectric layer, wherein a portion of the second graphene layer interfaces with the second portion of the first graphene layer.

14. The method for forming the semiconductor device structure as claimed in claim 11, further comprising:
forming a through-silicon via (TSV) over a front-side of the first substrate, wherein the insulating layer is in direct contact with the TSV.

15. The method for forming the semiconductor device structure as claimed in claim 11, further comprising:
forming a second substrate below the first substrate; and
forming a transistor device structure below the second substrate.

16. The method for forming the semiconductor device structure as claimed in claim 11, further comprising:
performing an annealing process on the first graphene layer, wherein no active device is formed in the first substrate before performing the annealing process.

17. A method for forming a semiconductor device structure, comprising:
forming a first dielectric layer over a first substrate, wherein the dielectric layer has a plurality of openings;
forming a catalyst layer over the first dielectric layer and in the openings;
forming a first graphene layer in the openings and on the catalyst layer, wherein the first graphene layer is formed on and below the catalyst layer to surround the catalyst layer;
forming an insulating layer in the first graphene layer;
forming a second dielectric layer over the first dielectric layer; and
forming a second graphene layer in and over the second dielectric layer, wherein a portion of the second graphene layer interfaces with a portion of the first graphene layer.

18. The method for forming the semiconductor device structure as claimed in claim 17, further comprising:
forming a third dielectric layer over the second dielectric layer; and
forming a third graphene layer in and over the third dielectric layer, wherein a portion of the third graphene layer interfaces with a portion of the second graphene layer.

19. The method for forming the semiconductor device structure as claimed in claim 17, further comprising:
   forming a through-silicon via (TSV) in the first substrate, wherein the TSV is in direct contact with another portion of the first graphene layer.

20. The method for forming the semiconductor device structure as claimed in claim 17, wherein the first graphene layer is in direct contact with the first dielectric layer after forming the first graphene layer in the openings.

\* \* \* \* \*